United States Patent
Ciubotaru

(10) Patent No.: US 9,172,354 B2
(45) Date of Patent: Oct. 27, 2015

(54) ANALOG ACTIVE LOW-PASS FILTERS

(71) Applicant: ANALOG DEVICES, INC., Norwood, MA (US)

(72) Inventor: Alexandru Ciubotaru, Somerset, NJ (US)

(73) Assignee: ANALOG DEVICES, INC., Norwood, MA (US)

( * ) Notice: Subject to any disclaimer, the term of this patent is extended or adjusted under 35 U.S.C. 154(b) by 13 days.

(21) Appl. No.: 14/084,351

(22) Filed: Nov. 19, 2013

(65) Prior Publication Data
US 2015/0137882 A1    May 21, 2015

(51) Int. Cl.
*H03K 5/00* (2006.01)
*H03H 11/04* (2006.01)
*H03H 11/12* (2006.01)

(52) U.S. Cl.
CPC ......... *H03H 11/0405* (2013.01); *H03H 11/126* (2013.01); *H03H 2011/0477* (2013.01)

(58) Field of Classification Search
CPC .................................................. H03K 5/1252
USPC ................................................. 327/551–559
See application file for complete search history.

(56) References Cited

U.S. PATENT DOCUMENTS

| | | | |
|---|---|---|---|
| 4,065,724 A | 12/1977 | Wicklund, Jr. | |
| 5,424,675 A * | 6/1995 | Matsushita | 327/558 |
| 6,028,479 A | 2/2000 | Babanezhad | |
| 6,313,687 B1 * | 11/2001 | Banu | 327/317 |
| 6,492,871 B2 | 12/2002 | Liu et al. | |
| 6,583,662 B1 * | 6/2003 | Lim | 327/553 |
| 6,618,579 B1 * | 9/2003 | Smith et al. | 455/307 |
| 6,816,004 B2 * | 11/2004 | Easwaran et al. | 327/552 |
| 6,909,321 B2 | 6/2005 | Stanley | |
| 6,967,606 B2 | 11/2005 | Wiesbauer et al. | |
| 7,339,418 B2 * | 3/2008 | Regier | 327/552 |
| 7,439,803 B1 * | 10/2008 | Dasgupta | 330/258 |
| 7,535,289 B2 * | 5/2009 | Kasperkovitz | 327/558 |
| 7,587,010 B2 * | 9/2009 | Morie et al. | 375/350 |
| 7,592,871 B1 | 9/2009 | Dasgupta | |
| 2006/0255997 A1 * | 11/2006 | Li et al. | 341/156 |
| 2015/0077183 A1 | 3/2015 | Ciubotaru | |

OTHER PUBLICATIONS

Carlosena, A. et al., "Current-Mode Multiple-Feedback Filters", IEEE Transactions on Circuits and Systems I; Feb. 1993; pp. 141-143; vol. 40, No. 2.

(Continued)

*Primary Examiner* — Dinh Le
(74) *Attorney, Agent, or Firm* — Knobbe, Martens, Olson & Bear, LLP

(57) ABSTRACT

Apparatus and methods for high-frequency low-pass filtering are disclosed. A first resistor is operatively coupled between a first node and a second node. A second resistor is operatively coupled between the second node and a third node. An amplifier circuit has a first input operatively coupled to the third node and a first output operatively coupled to a fourth node. The first output is configured to provide a first output signal. A first complex impedance network is operatively coupled between the fourth node and the third node. A first feedback path is operatively coupled between the fourth node and the second node. The first feedback path is configured to invert at least a portion of the first output signal. The first feedback path is further configured to provide a first feedback capacitance at the second node.

10 Claims, 8 Drawing Sheets

(56) References Cited

OTHER PUBLICATIONS

Carlosena, A. et al., "Novel Transimpedance Filter Topology for Instrumentation", IEEE Transactions on Instrumentation and Measurement; Aug. 1997; pp. 862-867; vol. 46, No. 4.

Carrillo, J.M. et al., "Constant-gm Constant-Slew-Rate High-Bandwidth Low-Voltage Rail-to-Rail CMOS Input Stage for VLSI Cell Libraries", IEEE Journal of Solid-State Circuits; Aug. 2003; pp. 1364-1372; vol. 38, No. 8.

Khorramabadi, H., "High-Frequency CMOS Continuous-Time Filters", IEEE Journal of Solid-State Circuits, vol. 8C-19, No. 6; Dec. 1984.

Klinke, R. et al., "A Very-High-Slew-Rate CMOS Operational Amplifier", IEEE J. Solid-State Circuits; Jun. 1989; pp. 744-746; vol. 24, No. 3.

Saari, V. et al., "A 240-MHz Low-Pass Filter With Variable Gain in 65-nm CMOS for a UWB Radio Receiver", IEEE Transactions on Circuits and Systems-1; Jul. 2009; pp. 1488-1499; vol. 56, No. 7.

Wierzba, G.M., "Op-Amp Relocation: A Topological Active Network Synthesis", IEEE Transactions on Circuits and Systems; May 1986; pp. 469-475; vol. CAS-33, No. 5.

Zumbahlen, H., "Analog Devices Mini Tutorial MT-222, Rev. A." Sallen-Key Filters, pp. 1-3, Analog Devices Inc., © 2012.

Zumbahlen, H. (ed.), "Linear Circuit Design Handbook", Chapter 8, pp. 8.1-8.144, Newnes, © 2008.

Analog Devices, "High Speed Current Feedback Op Amps", MT-057 Tutorial, Rev. 0, Oct. 2008.

Bruun, E., "CMOS Technology and Current-Feedback Op-Amps", Proc. Int. Symposium on Circuits and Systems, ISCAS 1993, pp. 1062-1065, vol. 2.

Chatterjee, S. et al., "Analog Circuit Design Techniques at 0.5 V", Springer, 2007, Ch 2, pp. 22-33.

Ismail, A.M. et al., "Novel CMOS Current Feedback Op-Amp Realization Suitable for High Frequency Applications", IEEE Trans. Circuits Syst. I, Jun. 2000, pp. 918-921, vol. 47, No. 6.

Manetakis, K. et al., "Current-feedback opamp suitable for CMOS VLSI technology", Electronics Letters, Jun. 6, 1996, pp. 1090-1092, vol. 32, No. 12.

Pennisi, S., "High-performance CMOS Current Feedback Operational Amplifier", Proc. Int. Symposium on Circuits and Systems, ISCAS 1995, pp. 1573-1576, vol. 2.

Selvanayagam, S. et al., "Wide bandwidth CMOS current feedback op amp for inverting amplifier applications", IEE Colloquium on Wideband Circuits, Modeling and Techniques, May 16, 1996, pp. 7/1-7/4.

Toumazou, C. et al. (editors), "Analogue IC design; the current-mode approach", Peter Peregrinus Ltd., 1990, Ch. 4, pp. 160-165, Ch. 16, pp. 579-583.

* cited by examiner

ANALOG ACTIVE LOW-PASS FILTERS

BACKGROUND

1. Field

Embodiments of the invention relate to electronic systems, and more particularly, to analog active low-pass filter circuits.

2. Description of the Related Technology

Noise and other undesirable signals may be introduced to a signal chain. Undesirable signals can negatively affect the quality of a signal and degrade system performance. Various signal processing techniques can be used to lessen the negative effects of undesirable signals. One example of such a signal processing technique is frequency-discriminatory filtering. For example, a low-pass filter can attenuate undesirable signals by attenuating frequencies above a cutoff frequency, while passing frequencies below the cutoff frequency. The cutoff frequency can be selected based on the frequency spectrum of the desirable signals and/or undesirable signals.

Filters can be implemented as passive filter circuits or active filter circuits. A passive filter does not include active components (such as operational amplifiers) and/or does not depend upon an external power supply. An active filter includes one or more active components in the circuit structure and/or depends upon an external power supply.

SUMMARY

One embodiment includes an apparatus, wherein the apparatus includes: a first amplification stage, wherein the first amplification stage includes: first, second, third, fourth, fifth, sixth, seventh, and eighth nodes; a first resistor operatively coupled between the first node and the second node; a second resistor operatively coupled between the second node and the third node; a third resistor operatively coupled between the fifth node and the sixth node; a fourth resistor operatively coupled between the sixth node and the seventh node; an amplifier circuit having a first input operatively coupled to the third node, a second input operatively coupled to the seventh node, a first output operatively coupled to the fourth node, wherein the first output is configured to provide a first output signal, and second output operatively coupled to the eighth node, wherein the second output of the amplifier circuit is configured to provide a second output signal; a first complex impedance network operatively coupled between the fourth node and the third node; a second complex impedance network operatively coupled between the eighth node and the seventh node; a first capacitor having a first end and a second end, wherein a first end of the first capacitor is operatively coupled to the eighth node, and wherein the second end of the first capacitor is operatively coupled to the second node; and a second capacitor having a first end and a second end, wherein a first end of the second capacitor is operatively coupled to the fourth node, and wherein the second end of the second capacitor is operatively coupled to the sixth node.

One embodiment includes an apparatus, wherein the apparatus includes: first, second, third, and fourth nodes; a first resistor operatively coupled between the first node and the second node; a second resistor operatively coupled between the second node and the third node; an amplifier circuit having an inverting input operatively coupled to the third node and an output operatively coupled to the fourth node, wherein the output is configured to provide an output signal; a complex impedance network operatively coupled between the fourth node and the third node; an inverter having an input and an output, wherein the input of the inverter is operatively coupled to the output of the amplifier circuit; and a capacitor having a first end and a second end, wherein a first end of the capacitor is operatively coupled to the output of the inverter, and wherein the second end of the capacitor is operatively coupled to the second node to form a positive feedback path.

One embodiment includes an apparatus, wherein the apparatus includes: a first amplification stage, wherein the first amplification stage includes: an amplifier circuit having at least a first input, a second input, and an output; a multiple feedback arrangement including: a capacitively-coupled positive feedback loop; and a negative feedback loop having a complex impedance.

BRIEF DESCRIPTION OF THE DRAWINGS

These drawings and the associated description herein are provided to illustrate specific embodiments of the invention and are not intended to be limiting.

DETAILED DESCRIPTION OF EMBODIMENTS

Figure 1:
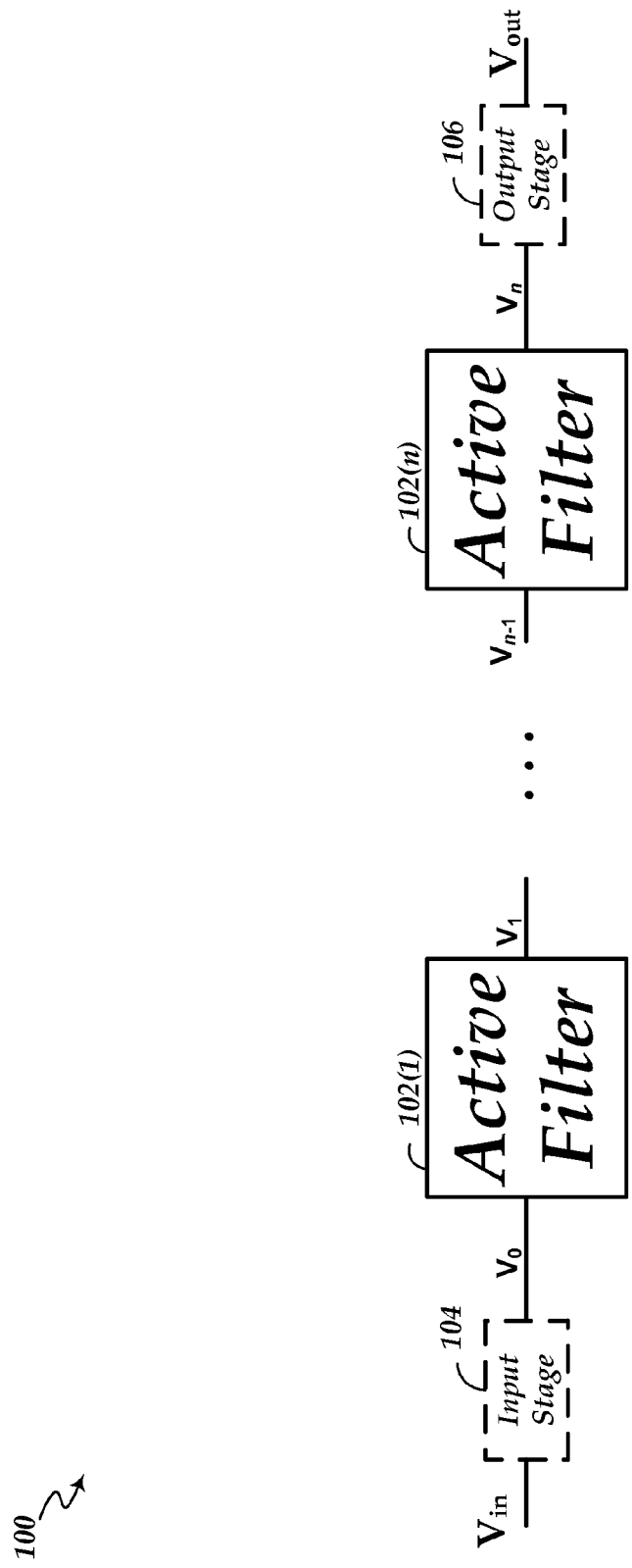
FIG. 1 is a schematic block diagram of an electronic filter that includes one or more active filters stages according to some embodiments.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Active filters can have advantages over passive filters. Advantages include a reduction in the size or number of components, such as inductors, and improved inter-stage isolation. Active filters can, however, have certain drawbacks, such as increased noise and noise sensitivity, reduced large-signal linearity, and reduced effectiveness for relatively high-frequency operation. Active filters can also use an external power source for operation, which can limit their use in power-constrained applications, such as mobile devices.

Low-pass filters pass relatively low frequencies and attenuate relatively high frequencies. A cutoff frequency can be defined by a point at which the power has fallen by a set amount, such as half power (3 dB). Herein, a low-pass filter's cutoff frequency may also be referred to as the low-pass filter's bandwidth. One or more of the various advantages of analog active low-pass filters have led to their integration in systems implemented, for example, in relatively low-voltage (such as 1.2 V) integrated-circuit technologies. Such filters can be of relatively high-order (for example, higher than 2). In one example, the cutoff frequencies can be extend to about several hundred megahertz (MHz), with effective large-signal linearity (for example, as output intermodulation distortion products several tens of decibels (dB) below the fundamental tones present in normal operation). Other frequency ranges will also be applicable.

To meet demanding objectives, such as high attenuation of out-of-band tones, and flat in-band filter response, more than one lower-order filter stages can be cascaded to achieve the desired overall frequency response of the composite filter. In some cases, the filter stages can have different filter characteristics, such as different damping ratios, quality factors, and/or natural frequencies. For example, Equations 1 and 2 are illustrative of a cascade of two low-pass filter stages represented by the transfer functions $H_1(s)$ and $H_2(s)$, respectively.

$$H_1(s) = \frac{H_{01}\omega_{01}^2}{s^2 + \alpha_{01}\omega_{01}s + \omega_{01}^2} \quad \text{(Eqn. 1)}$$

$$H_2(s) = \frac{H_{02}\omega_{02}^2}{s^2 + \alpha_{02}\omega_{02}s + \omega_{02}^2} \quad \text{(Eqn. 2)}$$

In Equations 1 and 2, the case for the complex variable $s=j2\pi f$ is used and represents the complex angular frequency $\omega$ (where f is the frequency in Hertz (Hz)), parameters $H_{01}=H_{02}=1$ are the pass-band gains, parameters $\omega_{01}=\omega_{02}=2\pi \cdot 400 \cdot 10^6$ rad/sec (corresponding to 400 MHz) are the cutoff angular frequencies, j represents the square root of $-1$, and parameters $\alpha_{o1}=0.7$, $\alpha_{o2}=2$ are the damping ratios. The frequency response of the composite filter $H_1(s) \cdot H_2(s)$ exhibits a low-pass characteristic with a cutoff frequency of about 400 MHz, approximately flat response up to the cutoff frequency, and a roll-off of the gain that corresponds to the roll-off of a 4th-order filter (for example, an 80 dB/decade roll-off). The composite filter $H_1(s) \cdot H_2(s)$ can have greater high-frequency attenuation than the individual filter stages $H_1(s)$, $H_2(s)$ alone. The damping ratios $\alpha_{01}$, $\alpha_{02}$ of the individual filter stages can affect the topology of the filter and/or the sizes of the components (for example, the sizes of resistors and/or capacitors) of the filter, as will be described in greater detail below.

A high-order (for example, an order greater than 2, or an order of 4 or greater) electronic low-pass filter with a high cutoff frequency can be difficult to implement. Furthermore, the choice of the topology of the filter can be restricted in order to achieve high linearity (low signal distortion), especially when the filter is to be used in a relatively low supply-voltage environment. By way of explanation, some active filter topologies can include an operational amplifier that receives inputs that vary substantially with the input signal. This dependency of the inputs of the operational amplifier can pose a problem in low-voltage systems, because the large-signal linearity of such a filter can also degrade due to relatively large variations in the node voltages of the input stage of the operational amplifier relative to the relatively small headroom available to the devices in the input stage. Accordingly, there is therefore a need for a way to increase the linearity of a low-supply-voltage, high-frequency active filter.

At the same time, because an increase in the number of active components can increase power consumption and cost and, furthermore, can limit the maximum operating frequency of the filter and degrade linearity, a reduction in the number of active components used in high-frequency active filters is also desirable.

In addition, in some conventional implementations, the components of some active filters are chosen with a large ratio of the maximum component value to minimum component value in order to achieve the desired filtering characteristics. However, large variations in the sizes of the various components can be undesirable because large ratios can increase chip size and cost. Moreover, it may be difficult to manufacture components with sufficient accuracy to achieve the desired ratios if the ratio is large. In addition to these manufacturing concerns, large ratios of component sizes can be undesirable based on performance considerations. For example, capacitors with large ratios of sizes can be problematic to implement in integrated circuits due to their associated parasitics. For example, the larger capacitor of a large ratio can have parasitic capacitances of the same order as the total amount of capacitance provided by the smaller capacitor. These parasitic capacitances appear connected unintentionally between different nodes of the original filter circuit and alter its fundamental circuit topology and frequency response, thereby negatively affecting filter performance. In addition, the frequency response of the filter may exhibit a strong sensitivity with respect to these parasitics, which is undesirable for repeatable and predictable filter performance, because the parasitics cannot be controlled as rigorously as the main filter components. Accordingly, there is therefore a need for reducing the ratio of the component sizes of high-frequency active filters Disclosed is an analog active low-pass filter architecture. Corresponding active filters can be embodied in a wide variety of integrated-circuit technologies, such as CMOS and other suitable semiconductor process technologies. Disclosed active filters can provide relatively high cutoff frequencies (for example, about 400 MHz or greater) and relatively low nonlinear distortion (for example, less than −60 dBc of output third-order intermodulation distortion products with a full-scale two-tone output signal). For example, an active filter can advantageously include a relatively low number of active filter stages, for example, one or two, though it will be understood that any number of active filter stages can be used. In one embodiment, the active filter includes one operational amplifier. In addition, the operational amplifier of the active filter operates with approximately zero input common-mode voltage, which is desirable for ensuring relatively low distortion by having essentially zero signal swing on the operational amplifier inputs. One additional advantage of the disclosed architecture is that active filters can desirably be implemented with reduced maximum-to-minimum component value ratios.

FIG. 1 is a schematic block diagram of an electronic filter 100 that includes n active filter stages 102(1)-102(n), where n can be one or more. The illustrated electronic filter 100 includes the n active filter stages 102(1)-102(n), which are cascaded, an input stage 104 operatively coupled to the input of the first active filter stage 102(1), and an output stage 106 operatively coupled to the output of the n-th active filter stage 102(n). In addition, in some embodiments, one or more of the elements can be omitted, such as the input stage 104 and/or the output stage 106. Moreover, additional input stages can be connected to the inputs of any of the active filter stages 102(1)-102(n), and/or additional output stages can be connected to the outputs of any of the active filter stages 102(1)-102(n).

The electronic filter 100 can be configured to receive an input signal $v_{in}$ as an input and to generate an output signal $v_{out}$ as an output. In one embodiment, the electronic filter 100 is configured to generate the output signal $v_{out}$ by attenuating frequencies of the input signal $v_{in}$ that are above a predetermined cutoff frequency. The electronic filter 100 can correspond to a low-pass analog filter included in a communications system, such as that used in modulators, demodulators, filters for mixers, receivers, transceivers, and the like. It will be appreciated that the electronic filter 100 can be used in other application, such as applications that perform high-frequency filtering, including non-communication applications.

Each of the active filter stages 102(1)-102(n) is configured to receive an input signal and to generate an output signal. In the illustrated embodiment, the active filter stages 102(1)-102(n) are cascaded so that the output of one active filter stage is operatively coupled to a subsequent active filter stage of the cascaded connection. The active filter stages 102(1)-102(n) can each correspond to a low-pass filter that attenuates frequencies above a cutoff frequency. The cutoff frequencies and damping ratios of the cascaded stages of the electronic filter 100 can be the same or can be different. For example, the active filter stage 102(1) can be configured to generate a signal $V_1$ based on attenuating the frequencies of a signal $V_0$ above the cutoff frequency of the active filter stage 102(1). In one embodiment, the active filter stages 102(1)-102(n) are low pass filters, with cutoff frequencies as high as 400 MHz or greater. In other embodiments, the active filter stages 102(1)-102(n) can correspond to other types of filters, such as high pass filters, band pass filters, and notch filters. The number n of active filter stages 102(1)-102(n) for the electronic filter 100 can be one or more. In one specific example embodiment, the number n of the stages is two. Various embodiments of the active filter stages will be described in greater detail later in connection with FIGS. 2-6.

The illustrated input stage 104 can be configured to receive the input signal $v_{in}$ as an input and to generate a signal $V_0$ as an output. For example, the input stage 104 can be configured to provide additional high-frequency attenuation of the input signal $v_{in}$. It will be appreciated that the input stage 104 can correspond to an active or passive filter. The input stage 104 will be described later in greater detail in connection with FIGS. 7-10.

The output stage 106 can be configured to receive an output signal, such as a signal $V_n$, of an active filter stage as an input and to generate the output signal $v_{out}$ as an output. For example, the output stage 106 can be configured to provide additional high-frequency attenuation. The output stage 106 can correspond to an active or passive filter. The output stage 106 will be described later in greater detail in connection with FIGS. 11-14.

Figure 2:
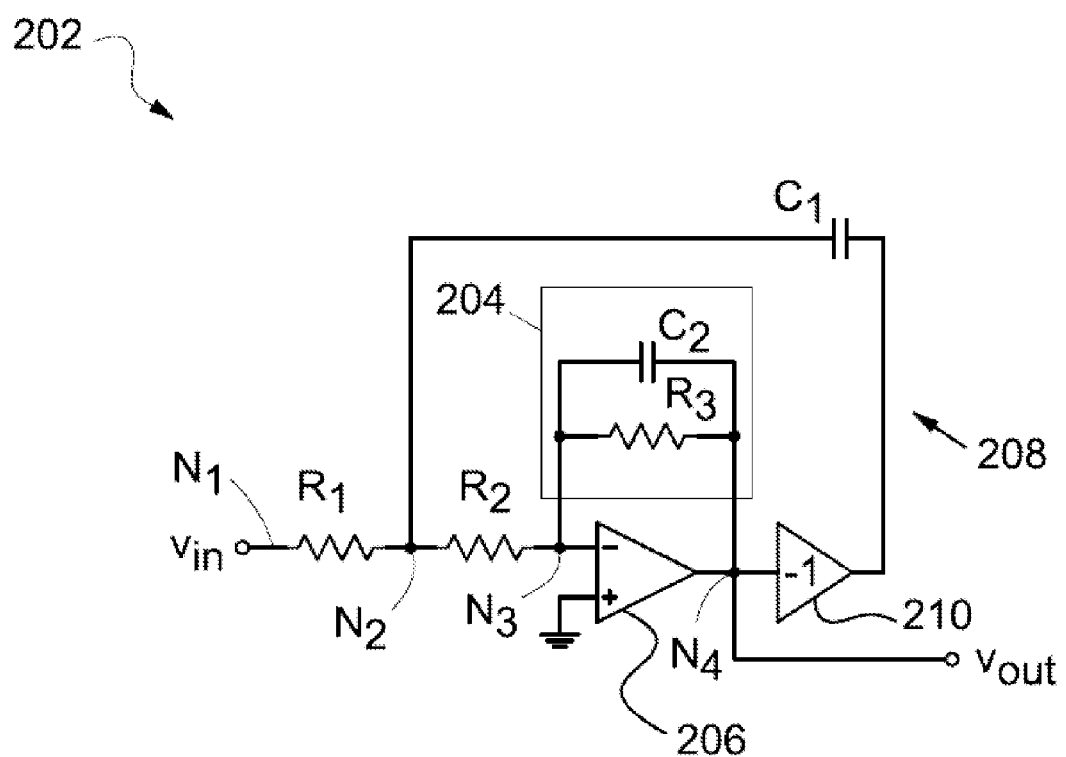
FIG. 2 is a schematic circuit diagram illustrating one embodiment of an active filter stage.

FIG. 2 is a schematic circuit diagram illustrating one embodiment of a low-pass active filter stage 202 that can be used for the active filter stages 102(1)-102(n) of FIG. 1. In particular, FIG. 2 illustrates an example of a single-ended embodiment with a single stage. The active filter stage 202 includes a resistor $R_1$, a resistor $R_2$, a complex impedance network 204, an amplifier circuit 206, and a positive feedback path 208. The illustrated complex impedance network 204 includes a parallel connection of a resistor $R_3$ and a capacitor $C_2$, which are arranged in a negative feedback loop. The illustrated positive feedback path 208 includes a unity-gain inverter 210 and a capacitor $C_1$. In alternative embodiments, the inverter 210 can include other than unity gain. Together, the positive feedback path 208 and the complex impedance network 204 form multiple feedback paths. The capacitors $C_1$ and $C_2$ correspond to deliberately added capacitance and not to parasitic capacitance. Of course, parasitic capacitance can be taken into account when determining capacitance values for the capacitors $C_1$ and $C_2$, but other topological changes (such as additional capacitances between capacitor terminals and ground) occur in the circuit when capacitor parasitics are present. In certain embodiments, the ground connection can be altered to accommodate a non-zero constant voltage source based on a desired operating condition.

The resistor $R_1$ is operatively coupled between a first node $N_1$ and a second node $N_2$. The resistor $R_1$ has a first end that is operatively coupled to the first node $N_1$ and a second end operatively coupled to the second node $N_2$. The resistor $R_1$ is configured to receive the input signal $v_{in}$ at the first end.

The resistor $R_2$ is operatively coupled between the second node $N_2$ and a third node $N_3$. For example, the resistor $R_2$ has a first end that is operatively coupled to the second node $N_2$, and a second end that is operatively coupled to the third node $N_3$. The first end of the resistor $R_2$ is configured to receive at least a portion of the input signal $v_{in}$ from the second end of the resistor $R_1$. As will be described below, the first end of the resistor $R_2$ is configured to receive a feedback signal from the positive feedback path 208 (for example, by way of the capacitor $C_1$).

The amplifier circuit 206 has a first input operatively coupled to the third node $N_3$, a second input operatively coupled to a voltage supply, and an output operatively coupled to a fourth node $N_4$. The amplifier circuit 206 should have a relatively high open loop gain, in the range 20 dB to 60 dB or more. These gain levels can also apply to the other amplifiers discussed herein. For example, the illustrated amplifier circuit 206 can correspond to an operational amplifier having an inverting input operatively coupled to the third node $N_3$ and a non-inverting input operatively coupled to a voltage reference or voltage bias, such as ground. Accordingly, the inverting input of the operational amplifier receives an input signal at the third node $N_3$. The output signal $v_{out}$ of the operational amplifier can be generated based at least on the signal at the third node $N_3$. In the illustrated embodiment, the output signal $v_{out}$ is inverted with respect to the input signal $v_{in}$. In operation, the inverting input of the amplifier circuit 206 can be swing-limited due to the non-inverting input being tied to a fixed voltage, which can include ground.

As an alternative to coupling the non-inverting input to ground, as discussed above, other embodiments described herein can include coupling the non-inverting input to any other voltage source. For example, the non-inverting input can be coupled to a constant non-zero voltage source based on a desired operating condition.

The complex impedance network 204 is operatively coupled between a fourth node $N_4$ and the third node $N_3$, and includes the capacitor $C_2$ and the resistor $R_3$ connected in parallel. A first end of the parallel connection of the capacitor $C_2$ and the resistor $R_3$ is operatively coupled to the fourth node $N_4$, a second end of the parallel connection of the capacitor $C_2$ and the resistor $R_3$ is operatively coupled to the third node $N_3$. In operation, the complex impedance network 204 can be configured to provide an RC local feedback provided by the resistor $R_3$ and the capacitor $C_2$ from the output of the amplifier circuit 206 to the inverting input of the amplifier circuit 206. Accordingly, the connection of the resistors $R_1$, $R_2$, the amplifier circuit 206, and the RC network of the complex impedance network 204 is configured to attenuate high frequencies of the input signal $v_{in}$.

The positive feedback path 208 is operatively coupled between the fourth node $N_4$ and the second node $N_2$, and includes the unity-gain inverter 210 and the capacitor $C_1$ connected in series between the fourth node $N_4$ and the second node $N_2$. The unity-gain inverter 210 has a first end (for example, an input of the inverter 210) operatively coupled to the fourth node $N_4$, and a second end (for example, an output of the inverter 210) operatively coupled to a first end of the capacitor $C_1$. Additionally, the capacitor $C_1$ has a second end operatively coupled to the second node $N_2$. Additionally, the positive feedback path 208 includes a capacitor $C_1$ coupled to the second node N2.

In one aspect, the connection of the second input resistor $R_2$, the amplifier circuit 206, and the RC network of the complex impedance network 204 form an active (RC) low-pass sub-filter. Furthermore, the positive feedback path 208 provides additional attenuation at high frequencies. For example, in operation, the positive feedback path 208 and the complex impedance network 204 provides capacitive feedback around the output and the first input of the amplifier circuit 206. In this way, it can be shown that the transfer function of the active filter stage 202 is given by Equations 3-6.

$$H_{LF}(s) = \frac{V_{out}(s)}{V_{in}(s)} = -\frac{H\omega_0^2}{s^2 + \alpha\omega_0 s + \omega_0^2}, \quad \text{(Eqn. 3)}$$

$$H = \frac{R_3}{R_1 + R_2}, \quad \text{(Eqn. 4)}$$

$$\omega_0^2 = \frac{R_1 + R_2}{C_1 C_2 R_1 R_2 R_3}, \quad \text{(Eqn. 5)}$$

$$\alpha\omega_0 = \frac{C_1 R_1 R_2 - C_1 R_1 R_3 + C_2 R_1 R_3 + C_2 R_2 R_3}{C_1 C_2 R_1 R_2 R_3}. \quad \text{(Eqn. 6)}$$

In order for damping ratio $\alpha$ to be positive, the numerator of Equation 6 should be positive. Accordingly, the following inequality expressed in Equation 7 should be met for a positive damping ratio $\alpha$.

$$C_1 R_1 R_2 + C_2 R_1 R_3 + C_2 R_2 R_3 > C_1 R_1 R_3. \quad \text{(Eqn. 7)}$$

The transfer function $H_{LF}$ (s) has a form of an inverting low-pass filter. Some advantageous aspects, among other, of the active filter stage 202 can be observed based on the following example. For the sake of clarity, the pass-band gain H in Equation 3 will be selected as unity (for example, $R_3=R_1+R_2$), which yields the relationships expressed in Equations 8 and 9.

$$\omega_0^2 = \frac{1}{C_1 C_2 R_1 R_2}, \quad \text{(Eqn. 8)}$$

$$\frac{\alpha}{\omega_0} = -C_1 \frac{R_1^2}{R_1 + R_2} + C_2(R_1 + R_2). \quad \text{(Eqn. 9)}$$

If the inequality expressed in Equation 10 is satisfied, the damping ratio $\alpha$ is positive.

$$\sqrt{\frac{C_2}{C_1}} > \frac{R_1}{R_1 + R_2}. \quad \text{(Eqn. 10)}$$

Accordingly, for a given cutoff frequency $\omega_0$ and positive damping ratio $\alpha$, Equations 8-10 can be used to select the circuit elements $R_1$, $R_2$, $C_1$, $C_2$. For example, the low-pass filter can be designed to achieve the following: a pass-band gain H=1, a cutoff frequency $f_0$=400 MHz ($\omega_0$=2π·400·10$^6$ rad/sec), and a damping ratio $\alpha$=0.7. Accordingly, if the values for $R_1$=200Ω and $C_1$=3 pF are selected, it can be determined from Equations 10-12 that values for $R_2$=145.97Ω, $R_3$=345.97Ω, and $C_2$=1.807 pF. As a result, the maximum-to-minimum resistance and capacitance ratios are in this case 2.37 and 1.66, respectively, which is readily implemented. In some conventional filters with similar desired performance, capacitance ratios as large as 16 can be obtained, which is clearly more problematic especially in integrated-circuit implementations.

In one embodiment, the active filter stage 202 is a low-pass filter circuit. For example, the active filter stage 202 is configured to provide an output signal $v_{out}$ at the fourth node $N_4$ based on the input signal $v_{in}$ such that frequencies of the input signal $v_{in}$ above a predetermined threshold or cutoff frequency are substantially attenuated.

In one embodiment, in operation, the inputs of the amplifier circuit 206 remain substantially fixed or static about an operating point. For example, due at least in part to the feedback arrangement of the active filter stage 202, the inverting input of the amplifier circuit 206 is driven to the value of the non-inverting input of the amplifier circuit 206 (for example, to about ground). Accordingly, during operation, the first input of the amplifier circuit 206 experiences relatively small variations about the value of the non-inverting input of the amplifier circuit 206, but is advantageously inhibited from experiencing relatively large-signal variations. Accordingly, the amplifier circuit 206 can operate substantially linearly about a selected operating point. As a result, the active filter stage 202 can operate with substantial linearity.

Figure 3:
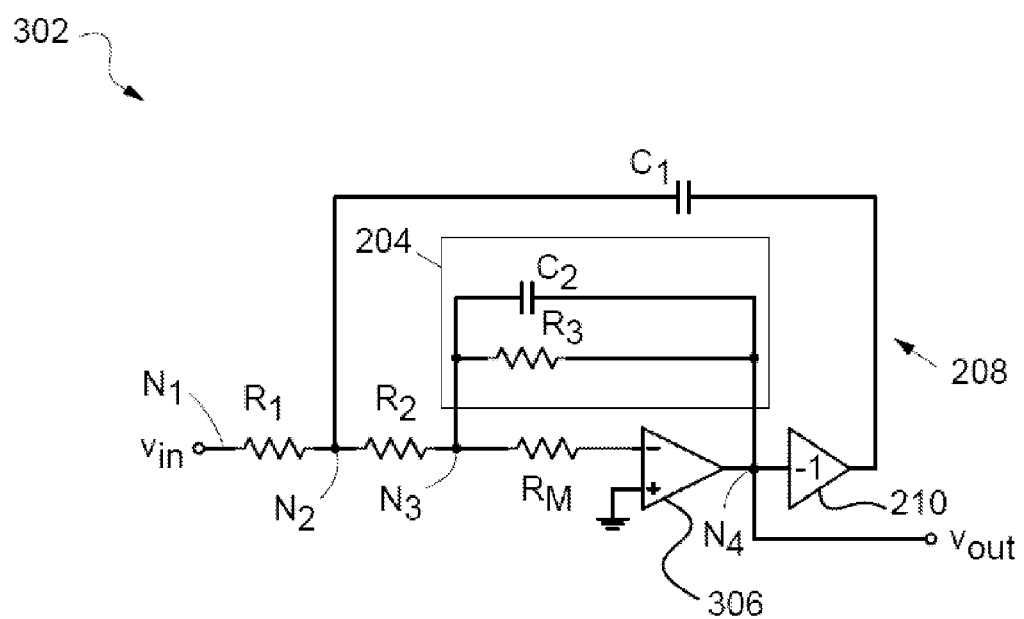
FIG. 3 is a schematic circuit diagram illustrating another embodiment of an active filter stage.

FIG. 3 is a schematic circuit diagram illustrating another embodiment of an active filter stage 302 that can be used for the active filter stages 102(1)-102(n) of FIG. 1. In particular, FIG. 3 illustrates an example of a single-ended, current-feedback embodiment with a single stage. Elements common to FIGS. 2 and 3 share common reference indicia, and in some instances, only differences between the figures are described herein for the sake of brevity.

The filter stage 302 includes a resistor $R_1$, a resistor $R_2$, a stability resistor $R_M$, a complex impedance network 204, an amplifier circuit 306, and a positive feedback path 208. The illustrated complex impedance network 204 includes a parallel connection of a resistor $R_3$ and a capacitor $C_2$. The illustrated feedback path includes an inverter 210 and a capacitor $C_1$. In certain embodiments, the ground connection can be altered to accommodate a non-zero constant voltage source based on a desired operating condition.

In the illustrated embodiment, the elements of the filter stage 302 are arranged in a configuration similar to the active filter stage 202 of FIG. 2. One difference from FIG. 2 is that the active filter stage 302 of FIG. 3 includes the stability resistor $R_M$. Additionally, the amplifier circuit 306 of FIG. 3 corresponds to a transimpedance amplifier. For example, the stability resistor $R_M$ has a first end operatively coupled to the third node $N_3$ and a second end operatively coupled to the inverting input of the transimpedance amplifier of the amplifier circuit 306. Accordingly, the illustrated embodiment of FIG. 3 corresponds to a single-ended low-pass filter utilizing a current-feedback operational amplifier, rather than a voltage-feedback operational amplifier, for better high-frequency performance.

Figure 4:
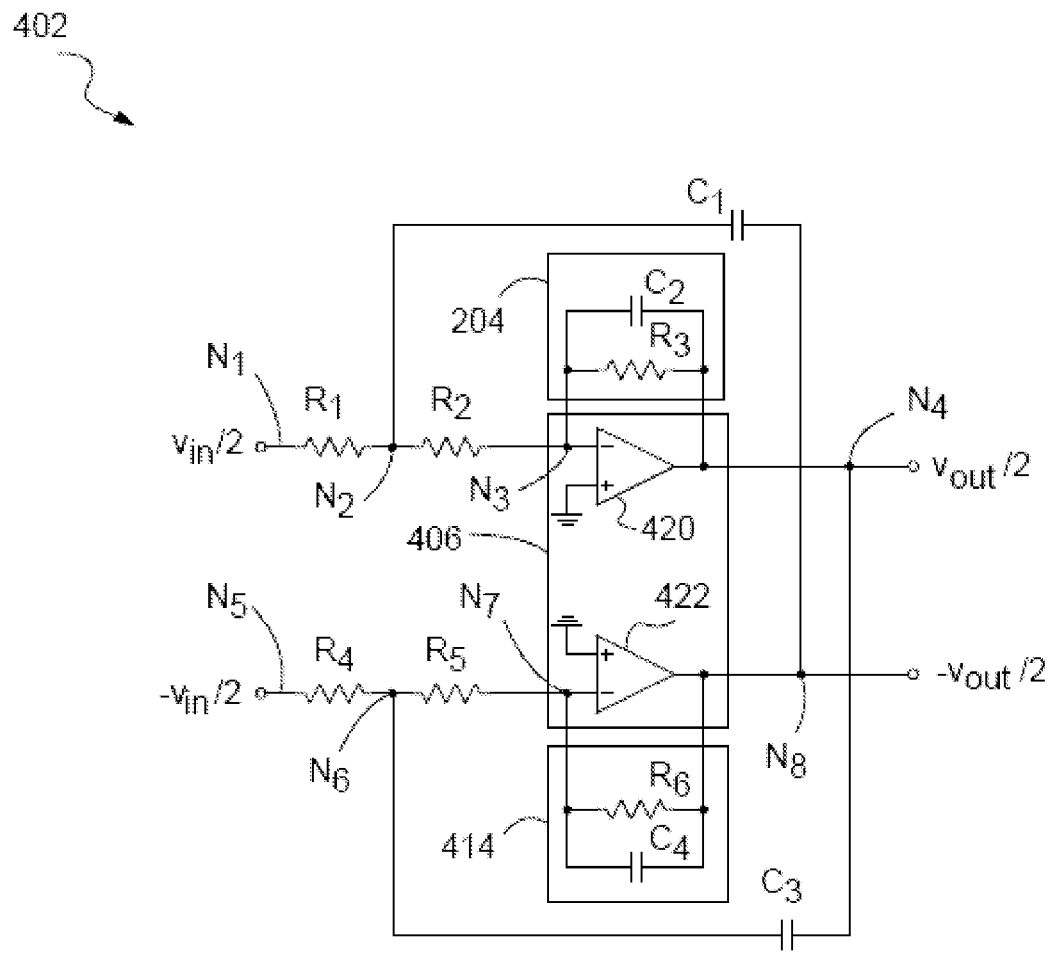
FIG. 4 is a schematic circuit diagram illustrating another embodiment of an active filter stage.

FIG. 4 is a schematic circuit diagram illustrating another embodiment of an active filter stage 402 that can be used for the active filter stages 102(1)-102(n) of FIG. 1. In particular, FIG. 4 illustrates an example of a differential embodiment. Elements common to FIGS. 2 and 4 share common reference indicia, and in some instances, only differences between the figures are described herein for the sake of brevity. The active filter stage 402 includes a resistor $R_1$, a resistor $R_2$, a first complex impedance network 204, an amplifier circuit 406, and a capacitor $C_1$. In addition, the active filter stage 402 further includes a resistor $R_4$, (where $R_4=R_1$) a resistor $R_5$, (where $R_5=R_2$) a second complex impedance network 414, and a capacitor $C_3$. (where $C_3=C_1$) The illustrated amplifier circuit 406 includes a first operational amplifier 420 and a second operational amplifier 422. The illustrated first complex impedance network 204 includes a parallel connection of a resistor $R_3$ and a capacitor $C_2$. The illustrated second complex impedance network 414 includes a parallel connection of a resistor $R_6$ (where $R_6=R_3$) and a capacitor $C_4$. (where $C_4=C_2$) The capacitors $C_3$ and $C_4$ correspond to deliberately added capacitance and not to parasitic capacitance.

The amplifier circuit 402 is configured to receive differential inputs $v_{in/2}$ and $-v_{in/2}$ as inputs at a first node $N_1$ and a fifth node $N_5$, respectively. In addition, the amplifier circuit 402 is configured to generate differential outputs $v_{out/2}$ and $-v_{out/2}$ as outputs at a fourth node $N_4$ and an eighth node $N_8$. For example, the first operational amplifier 420 of the illustrated amplifier circuit 406 is configured to receive (for example, at the inverting input) a frequency-dependent combination of the positive-side input signal $v_{in/2}$ and of the output signals $v_{out/2}$ and $-v_{out/2}$ and to generate the resulting positive-side output $v_{out/2}$. In addition, the second operational amplifier 422 of the illustrated amplifier circuit 406 is configured to receive (for example, at the inverting input) a complementary frequency-dependent combination of the negative-side input signal $-v_{in/2}$ and of the output signals $v_{out/2}$ and $-v_{out/2}$ and to generate the resulting negative-side output $-v_{out/2}$. The non-inverting inputs of the first and second operational amplifiers 420, 422 can be operatively coupled to a voltage reference or bias, such as ground. In other embodiments, the non-inverting inputs can be operatively coupled to any suitable voltage source.

The first input resistor $R_1$, the resistor $R_2$, the capacitor $C_1$, the resistor $R_3$ of the first complex impedance network 204, the capacitor $C_2$ of the first complex impedance network 204, and the first operational amplifier 420 of the amplifier circuit 406 are arranged in a similar topology as described earlier in connection with FIG. 2.

In the illustrated embodiment, a feedback path is formed between the fourth node $N_4$ and the second node $N_2$. For example, the output of the first operational amplifier 420 is operatively coupled to the inverting input of the second operational amplifier 422, and the output of the second operational amplifier 422 is, in turn, operatively coupled to the capacitor $C_1$. Accordingly, the second operational amplifier 422 is configured to perform, due to the nature of the differential configuration, a function similar to the function performed by the inverter 210 of the positive feedback path 208 of FIG. 2. Accordingly, the path taken from the fourth node $N_4$, the sixth node $N_6$ through the capacitor $C_3$, the eighth node $N_8$ through the inverting input of the second operational amplifier 422, and the second node $N_2$ through the capacitor $C_1$ corresponds to the positive feedback path 208 of FIG. 2.

In addition, the resistor $R_4$ is operatively coupled between a fifth node $N_5$ and a sixth node $N_6$. Furthermore, the resistor R5 is operatively coupled between the sixth node $N_6$ and a seventh node $N_7$. The seventh node $N_7$ corresponds to the node N3 of the inverting input of the second operational amplifier 422, and receives a signal which is a complementary signal of the signal received by N3. Accordingly, the resistors $R_4$, $R_5$ are arranged in series similar to $R_1$, $R_2$, and one end of the series arrangement of the resistors $R_4$, $R_5$ is coupled to the seventh node N7.

The second complex impedance network 414 is operatively coupled between an eighth node $N_8$ and the seventh node $N_7$. For example, the illustrated second complex impedance network 414 includes the capacitor $C_4$ and the resistor $R_6$ arranged in parallel. A first end of the parallel arrangement of the capacitor $C_4$ and the resistor $R_6$ is operatively coupled to the eighth node $N_8$, and a second end of the parallel arrangement of the capacitor $C_4$ and the resistor $R_6$ is operatively coupled to the seventh node $N_7$. In operation, the second complex impedance network 414 is configured to provide an RC local feedback, based on the resistor $R_6$ and the capacitor $C_4$, from the output of the second operational amplifier 422 to the inverting input of the second operational amplifier 422, similar to the way the first complex impedance network 204 is configured to provide an RC local feedback based on the resistor $R_3$ and the capacitor $C_2$ from the output of the first operational amplifier 420 to the inverting input of the first operational amplifier 420.

In the illustrated embodiment, a second feedback path is formed between the eighth node $N_8$ and the sixth node $N_6$. For example, the output of the second operational amplifier 422 is operatively coupled to the inverting input of the first operational amplifier 420, and the output of the first operational amplifier 420 is, in turn, operatively coupled to the capacitor $C_3$. Accordingly, the first operational amplifier 420 is configured to invert the output signal of the second operational amplifier 422. Accordingly, the path taken from the eighth node $N_8$, the second node $N_2$ through the capacitor $C_1$, the fourth node $N_4$ through the inverting input of the first operational amplifier 420, and the sixth node $N_6$ through the capacitor $C_3$ corresponds to the second feedback path, which, due to the differential nature of the circuit, operates with signals complementary to the signals associated with the first feedback path described above.

In operation, the active filter stage 402 receives the differential inputs $v_{in/2}$ and $-v_{in/2}$ as inputs at the first node $N_1$ and the fifth node $N_5$, respectively. In addition, the active filter stage 402 generates the differential outputs $v_{out/2}$ and $-v_{out/2}$ as outputs at the fourth node $N_4$ and the eighth node N8. For example, the active filter stage 402 generates the differential outputs $v_{out/2}$ and $-v_{out/2}$ by attenuating frequencies of the differential inputs $v_{in/2}$ and $-v_{in/2}$ above a predetermined cut-off frequency.

In one aspect, the illustrated embodiment of Figure includes two symmetrical circuits with the same configuration as the active filter stage embodiment of FIG. 2. As described above, the role of the unity-gain inverter is now taken by the outputs of each of the two symmetrical circuits in FIG. 4, and it should be noted that both in-phase and out-of-phase signals can be obtained from the differential outputs $v_{out}/2$, $-v_{out}/2$. In this way, there is no need for dedicated circuits (inverters) for signal inversion. The equations derived earlier in connection with FIG. 2 are also valid for the active filter stage 402 of FIG. 4.

Figure 5:
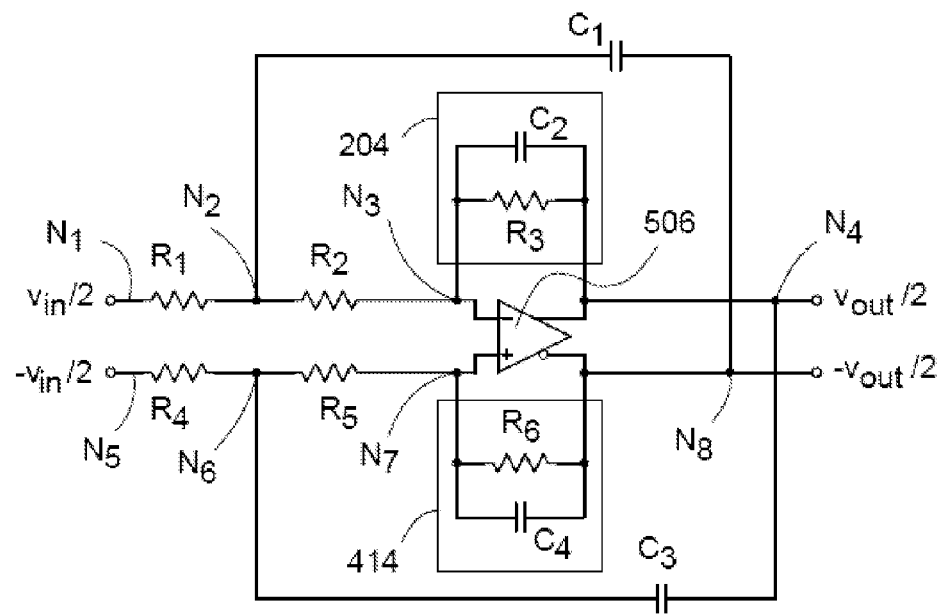
FIG. 5 is a schematic circuit diagram illustrating another embodiment of an active filter stage.

FIG. 5 is a schematic circuit diagram illustrating another embodiment of an active filter stage 502 that can be used for the active filter stages 102(1)-102(n) of FIG. 1. In particular, FIG. 5 illustrates another example differential embodiment. In one aspect, the active filter stage 502 can include a fully differential operational amplifier instead of the two single ended operational amplifiers 420, 422, as described in greater detail below. Elements common to FIGS. 4 and 5 share common reference indicia, and in some instances, only differences between the figures are described herein for the sake of brevity.

The active filter stage 502 includes a resistor $R_1$, a resistor $R_2$, a first complex impedance network 204, an amplifier circuit 506, and a capacitor $C_1$. In addition, the active filter stage 502 further includes a resistor $R_4$, a resistor $R_5$, a second complex impedance network 414, and a capacitor $C_3$. The illustrated first complex impedance network 204 includes a parallel connection of a resistor $R_3$ and a capacitor $C_2$. The illustrated second complex impedance network 414 includes a parallel connection of a resistor $R_6$ and a capacitor $C_4$.

The amplifier circuit 506 corresponds to a fully differential operational amplifier having a first input (for example, an inverting input) operatively coupled to a third node $N_3$, a second input (for example, a non-inverting input) operatively coupled to a seventh node $N_7$, a first output operatively coupled to the fourth node $N_4$, and a second output operatively coupled to the eighth node $N_8$.

The equations derived above for the active filter stage 202 of FIG. 2 are also valid for the active filter stage 502 of FIG. 5. Furthermore, the active filter stage 502 can be cascaded with two or more active filter stages (for example, as described above in connection with FIG. 1).

Accordingly, the architecture shown in FIG. 5 can provide high cutoff frequencies (for example, about 400 MHz or greater) and relatively low amounts of nonlinear distortion (for example, less than about −60 dBc of output third-order intermodulation distortion products with a full-scale two-tone output signal). For example, an electronic filter can include a relatively low number of active components (for example, one for each active filter stage). In addition, the amplifier circuit 506 of the active filter stage 502 operates with essentially zero input common-mode voltage based on the inputs of the amplifier circuit 506 and thus has essentially no signal swing at the input of the amplifier circuit 506. Accordingly, the active filter stage 502 can have substantially linear dynamics. Advantageously, amplifier stages according to the disclosed architecture can have reduced maximum-to-minimum component value ratios, as described above.

Figure 6:
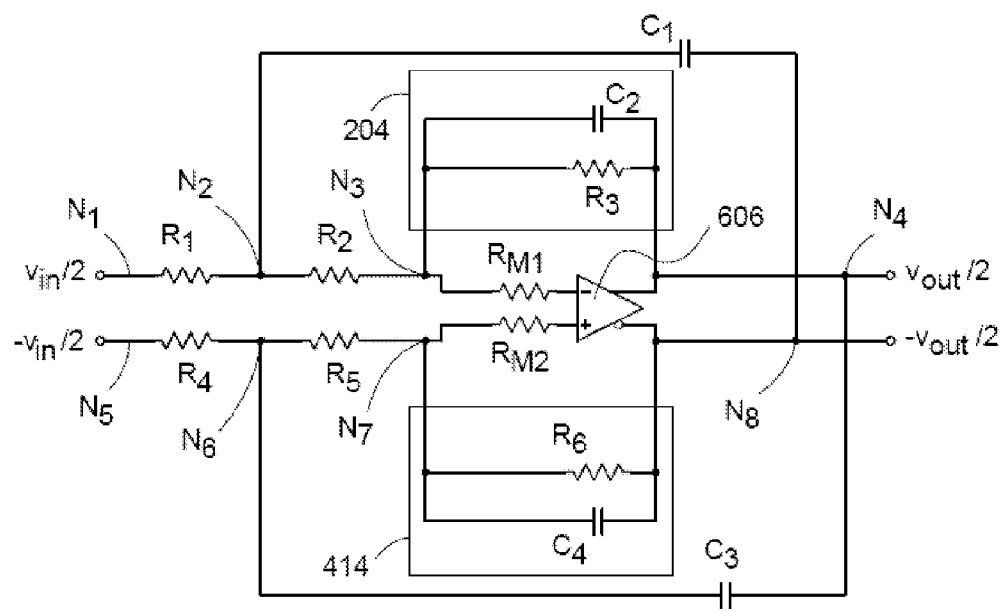
FIG. 6 is a schematic circuit diagram illustrating another embodiment of an active filter stage.

FIG. 6 is a schematic circuit diagram illustrating another embodiment of an active filter stage 602 that can be used for the active filter stages 102(1)-102(n) of FIG. 1. In particular, FIG. 6 illustrates an example of a differential, current-feedback embodiment. Elements common to FIGS. 5 and 6 share common reference indicia, and in some instances, only differences between the figures are described herein for the sake of brevity.

The active filter stage 602 further includes stability resistors $R_{M1}$, $R_{M2}$. In the illustrated embodiment, a differential transimpedance amplifier circuit 606 is used in the place of the fully differential operational amplifier 506 (FIG. 5). In certain embodiments, not all of the illustrated elements and connections are used. For example, the stability resistors $R_{M1}$, $R_{M2}$ can be selected based on stability consideration. However, these resistors can be omitted in certain embodiments.

In the illustrated embodiment, the elements of the active filter stage 602 are arranged in a manner similar to the arrangement of the active filter stage 502 of FIG. 5, except, for example, the inclusion of the stability resistors $R_{M1}$, $R_{M2}$. Furthermore, the amplifier circuit 606 corresponds to a differential transimpedance amplifier, instead of a voltage operational amplifier. For example, the stability resistor $R_{M1}$ has a first end operatively coupled to the third node N3 and a second end operatively coupled to the inverting input of the transimpedance amplifier. The stability resistor $R_{M2}$ has a first end operatively coupled to the seventh node N7 and a second end operatively coupled to the non-inverting input of the transimpedance amplifier. The transimpedance amplifier is configured to output a voltage based on the current difference between its inputs. Accordingly, the illustrated embodiment of FIG. 6 corresponds to a differential low-pass filter utilizing a current-feedback operational amplifier (for example, rather than a voltage-feedback operational amplifier), for better high-frequency performance.

FIGS. 7-10 are circuit diagrams illustrating example embodiments of an input stage of FIG. 1. Elements common to the various figures share common reference indicia, and in some instances, only differences between the figures are described herein for the sake of brevity.

Figure 7:
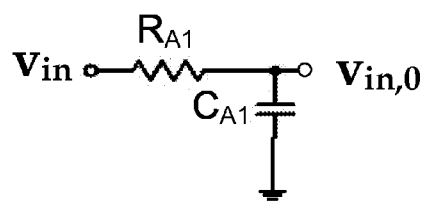
FIGS. 7-10 are circuit diagrams illustrating example embodiments of an input stage.

FIG. 7 is a circuit diagram illustrating an example embodiment of a single-ended passive input stage 704 that can be used for the input stage 104 of FIG. 1. The input stage 704 includes a resistor $R_{A1}$ and a capacitor $C_{A1}$. The capacitor $C_{A1}$ corresponds to deliberately added capacitance and not merely to parasitic capacitance. The resistor $R_{A1}$ has a first end configured to receive an input signal $v_{in}$ and a second end operatively coupled to the input of an active filter stage, for example the first node $N_1$ of FIGS. 2-3. The capacitor $C_{A1}$ has a first end operatively coupled to the input of the active filter stage. The capacitor $C_{A1}$ has a second end operatively coupled to a voltage reference or voltage bias, such as ground.

In operation, the passive input stage 704 can provide additional attenuation of high frequencies. For example, high frequencies can be shunted to ground via the input capacitor $C_{A1}$. One advantage, among many, of the passive input stage 704 is that it can effectively provide some high-frequency attenuation without the addition of active devices. Accordingly, the passive input stage 704 can improve filtering without substantially increasing power consumption and/or without decreasing linearity.

Figure 8:
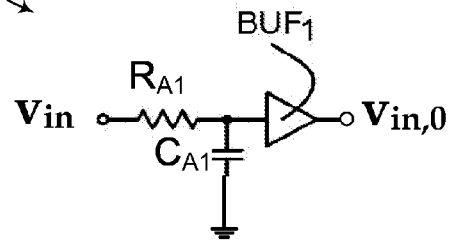

FIG. 8 is a circuit diagram illustrating an example embodiment of a single-ended active input stage 804 that can be used for the input stage 104 of FIG. 1. The input stage 804 can include an arrangement of elements similar to the embodiment described earlier in connection with FIG. 7. A buffer $BUF_1$ can be disposed in a signal path between the input resistor $R_{A1}$-input capacitance $C_{A1}$ connection and the input of the active filter stage. The buffer $BUF_1$ can serve to isolate the dynamics of the input stage 804 and the active filter stages. One advantage of the illustrated embodiment of FIG. 8 is that inclusion of the buffer $BUF_1$ can increase the order of the filter without substantially complicating the design and/or analysis of the filter.

Figure 9:
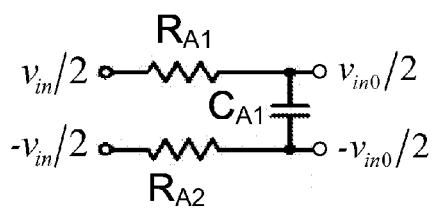

FIG. 9 is a circuit diagram illustrating an example embodiment of a differential passive input stage 904 that can be used for the input stage 104 of FIG. 1. The input stage 904 can include an arrangement of elements similar to the embodiment described above in connection with FIG. 7. In addition, a second resistor $R_{A2}$ (where $R_{A2}=R_A$) can be included. The illustrated input resistor $R_{A2}$ has a first end configured to receive an input signal $-v_{in/2}$ and a second end operatively coupled to a second input of an active filter stage, for example the fifth node $N_5$ of FIGS. 4-6. The illustrated input capacitor $C_{A1}$ is operatively coupled between the second ends of the resistors $R_{A1}$, $R_{A2}$ of the input stage 904. In operation, the input stage 904 provides additional high-frequency attenuation to the attenuation of the active filter stages. Accordingly, the passive input stage 904 can improve filtering without substantially increasing power consumption and/or without decreasing linearity.

Figure 10:
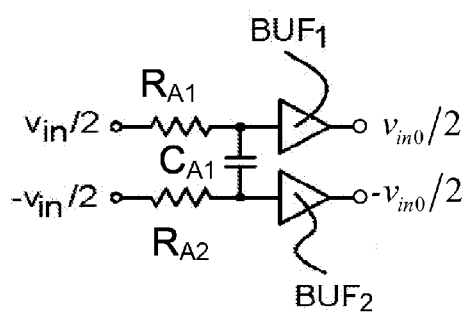

FIG. 10 is a circuit diagram illustrating an example embodiment of a differential active input stage 1004 that can be used for the input stage 104 of FIG. 1. The input stage 1004 can include an arrangement of elements similar to the embodiment described above in connection with FIG. 9. In addition, first and second identical buffers $BUF_1$, $BUF_2$ can be disposed between the connection of the input resistors $R_{A1}$, $R_{A2}$ and the first and second inputs of the active filter stage. The buffers $BUF_1$, $BUF_2$ can serve to isolate the dynamics of the input stage 1004 and the active filter stages. Accordingly, one advantage of the illustrated embodiment of FIG. 10 is that the inclusion of the buffers $BUF_1$, $BUF_2$ can increase the order of the filter without substantially complicating the design and/or analysis of the filter.

FIGS. 11-14 are circuit diagrams illustrating example embodiments of an output stage of FIG. 1. Elements common to the various figures share common reference indicia, and in some instances, only differences between the figures are described herein for the sake of brevity.

Figure 11:
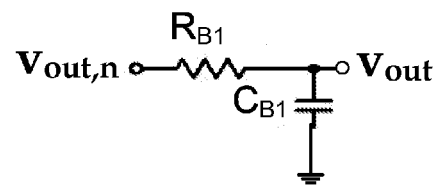
FIGS. 11-14 are circuit diagrams illustrating example embodiments of an output stage.

FIG. 11 is a circuit diagram illustrating an example embodiment of a single-ended passive output stage 1106 that can be used for the output stage 106 of FIG. 1. The output stage 1106 includes a resistor $R_{B1}$ and a capacitor $C_{B1}$. The capacitor $C_{B1}$ corresponds to deliberately added capacitance and not merely to parasitic capacitance. The resistor $R_{B1}$ has a first end configured to receive a signal $v_{out,n}$ (for example, from an output of an active filter stage) and a second end to provide an output signal $v_{out}$. The capacitor $C_{B1}$ has a first end operatively coupled to the second end of the resistor $R_{B1}$. The capacitor $C_{B1}$ has a second end operatively coupled to a voltage reference or voltage bias, such as ground.

In operation, the passive output stage 1106 can provide additional attenuation of high frequencies. For example, high frequencies can be shunted to ground via the output capacitor $C_{B1}$. One advantage, among many, of the passive output stage 1106 is that it can effectively provide some high-frequency attenuation without the addition of active devices. Accordingly, the passive output stage 1106 can improve filtering without substantially increasing power consumption and/or without decreasing linearity.

Figure 12:
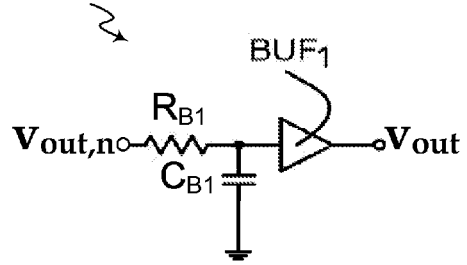

FIG. 12 is a circuit diagram illustrating an example embodiment of a single-ended active output stage 1206 that can be used for the output stage 106 of FIG. 1. The output stage 1206 can include an arrangement of elements similar to the embodiment described above in connection with FIG. 11. In addition, a buffer $BUF_1$ can be disposed in a signal path between the connection of the resistor $R_{B1}$-capacitor $C_{B1}$ connection and the output of the active output stage 1206. The buffer $BUF_1$ can serve to isolate the dynamics of the output stage 1206 and the active filter stages. Accordingly, one advantage of the illustrated embodiment of FIG. 12 is that the inclusion of the buffer $BUF_1$ can increase the order of the filter without substantially complicating the design and/or analysis of the filter.

Figure 13:
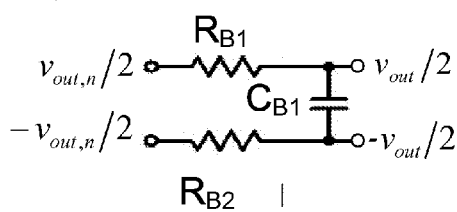

FIG. 13 is a circuit diagram illustrating an example embodiment of a differential passive output stage 1306 that can be used for the output stage 106 of FIG. 1. The output stage 1306 can include an arrangement of elements similar to the embodiment described above in connection with FIG. 11. In addition, a resistor $R_{B2}$ (where $R_{B2}=R_{B1}$) can be included. The resistor $R_{B2}$ has a first end configured to receive a signal $-v_{out,n/2}$ and a second end operatively coupled to a second output of the output stage 1306. The capacitor $C_{B1}$ is operatively coupled between the second ends of the resistors $R_{B1}$, $R_{B2}$ of the output stage 1306. In operation, the output stage 1306 can provide high-frequency attenuation in addition to the attenuation of the active filter stages without adding active components. Accordingly, the passive output stage 1306 can improve filtering without substantially increasing power consumption and/or without decreasing linearity.

Figure 14:
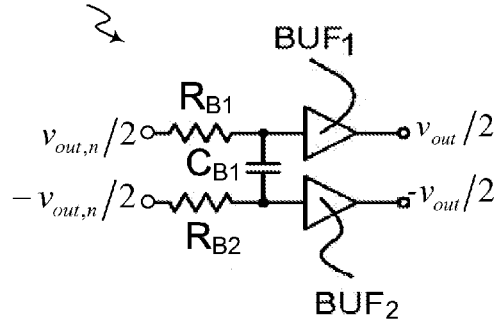

FIG. 14 is a circuit diagram illustrating an example embodiment of a differential active output stage 1406 that can be used for the output stage 106 of FIG. 1. The output stage 1406 can include an arrangement of elements similar to the embodiment described above in connection with FIG. 13. In addition, first and second identical buffers $BUF_1$, $BUF_2$ can be disposed between the connection of the resistors $R_{B1}$, $R_{B2}$ and the outputs of the active output stage 1406. The buffers $BUF_1$, $BUF_2$ can serve to isolate the dynamics of the output stage 1406 and the active filter stages. Accordingly, one advantage of the illustrated embodiment of FIG. 14 is that the inclusion of the buffers $BUF_1$, $BUF_2$ can increase the order of the electronic filter without substantially complicating the design and/or analysis of the filter.

EXAMPLES OF APPLICATIONS

Devices employing the above-described schemes can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, base stations, communication modems, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

Some of the embodiments disclosed herein have been described with specific signals implemented as current-mode or voltage-mode signals, but the inventive principles also contemplate other types of signals, whether characterized as voltages or currents.

Moreover, the foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

What is claimed is:
1. An apparatus comprising:
 a first amplification stage, the first amplification stage comprising:
  first, second, third, fourth, fifth, sixth, seventh, and eighth nodes;
  a first resistor operatively coupled between the first node and the second node;

a second resistor operatively coupled between the second node and the third node;

a third resistor operatively coupled between the fifth node and the sixth node;

a fourth resistor operatively coupled between the sixth node and the seventh node;

an amplifier circuit having a first input operatively coupled to the third node, a second input operatively coupled to the seventh node, a first output operatively coupled to the fourth node, wherein the first output is configured to provide a first output signal, and a second output operatively coupled to the eighth node, wherein the second output of the amplifier circuit is configured to provide a second output signal;

a first complex impedance network operatively coupled between the fourth node and the third node;

a second complex impedance network operatively coupled between the eighth node and the seventh node;

a first capacitor having a first end and a second end, wherein a first end of the first capacitor is operatively coupled to the eighth node, and wherein the second end of the first capacitor is operatively coupled to the second node; and a second capacitor having a first end and a second end, wherein a first end of the second capacitor is operatively coupled to the fourth node, and wherein the second end of the second capacitor is operatively coupled to the sixth node, a fifth resistor having a first end and a second end, wherein the first end is coupled to the third node and the second end is coupled to the first input of the amplifier circuit to operatively couple the third node to the first input; and a sixth resistor having a first end and a second end, wherein the first end is coupled to the seventh node and the second end is coupled to the second input of the amplifier circuit to operatively couple the seventh node to the second input.

2. The apparatus of claim 1, further comprising a second amplification stage, wherein the first and second amplification stages are cascaded.

3. The apparatus of claim 1, wherein the amplifier circuit comprises a first operational amplifier and a second operational amplifier, wherein the first input of the amplifier circuit comprises an inverting input of the first operational amplifier, wherein the first output of the amplifier circuit comprises an output of the first operational amplifier, wherein the second input of the amplifier circuit comprises an inverting input of the second operational amplifier, and wherein the second output of the amplifier circuit comprises an output of the second operational amplifier.

4. The apparatus of claim 1, wherein the amplifier circuit comprises a current-feedback operational amplifier, wherein the current-feedback operational amplifier has an inverting input, a non-inverting input, an inverting output, and a non-inverting output, wherein the first input of the current-feedback operational amplifier comprises the inverting input, wherein the second input of the current-feedback operational amplifier comprises the non-inverting input, wherein the first output of the current-feedback operational amplifier comprises the non-inverting output, wherein the second output of the current-feedback operational amplifier comprises the inverting output.

5. The apparatus of claim 1, further comprising an input stage circuit operatively coupled to the first node and to the fifth node, the input stage circuit comprising:

a seventh resistor having a first end configured to receive a first input signal and a second end operatively coupled to the first node;

an eighth resistor having a first end configured to receive a second input signal and a second end operatively coupled to the fifth node; and a third capacitor having a first end operatively coupled to the first node and a second end operatively coupled to the fifth node.

6. The apparatus of claim 1, further comprising: an output stage circuit operatively coupled to the fourth node and the eighth node, the output stage circuit comprising:

a seventh resistor having first and second ends, wherein the first end of the fifth resistor is operatively coupled to the fourth node;

an eighth resistor having first and second ends, wherein the first end of the sixth resistor is operatively coupled to the eighth node; and a third capacitor having a first end operatively coupled to the second end of the fifth resistor and a second end operatively coupled to the second end of the sixth resistor.

7. The apparatus of claim 6, further comprising ninth and tenth nodes;

a first buffer having an input operatively coupled to the first end of the third capacitor and an output operatively coupled to the ninth node; and a second buffer having an input operatively coupled to the second end of the third capacitor and an output operatively coupled to the tenth node.

8. The apparatus of claim 1, wherein the amplifier circuit comprises a current-feedback operational amplifier.

9. An apparatus comprising:

a first amplification stage, the first amplification stage comprising:

first, second, third, fourth, fifth, sixth, seventh, and eighth nodes;

a first resistor operatively coupled between the first node and the second node;

a second resistor operatively coupled between the second node and the third node;

a third resistor operatively coupled between the fifth node and the sixth node;

a fourth resistor operatively coupled between the sixth node and the seventh node;

an amplifier circuit having a first input operatively coupled to the third node, a second input operatively coupled to the seventh node, a first output operatively coupled to the fourth node, wherein the first output is configured to provide a first output signal, and a second output operatively coupled to the eighth node, wherein the second output of the amplifier circuit is configured to provide a second output signal;

a first complex impedance network operatively coupled between the fourth node and the third node;

a second complex impedance network operatively coupled between the eighth node and the seventh node;

a first capacitor having a first end and a second end, wherein a first end of the first capacitor is operatively coupled to the eighth node, and wherein the second end of the first capacitor is operatively coupled to the second node;

a second capacitor having a first end and a second end, wherein a first end of the second capacitor is operatively coupled to the fourth node, and wherein the second end of the second capacitor is operatively coupled to the sixth node;

a fifth resistor having a first end and a second end, wherein the first end is coupled to the third node and the second end is coupled to the first input of the amplifier circuit to operatively couple the third node to the first input; and a sixth resistor having a first end and a second end, wherein the first end is coupled to the seventh node and the second end is coupled to the second input of the amplifier circuit to operatively couple the seventh node to the second input; and an input stage circuit operatively coupled to the first node, the input stage circuit comprising:

ninth and tenth nodes;

a seventh resistor having a first end configured to receive a first input signal and a second end operatively coupled to the ninth node;

an eighth resistor having a first end configured to receive a second input signal and a second end operatively coupled to the tenth node;

a third capacitor having a first end operatively coupled to the ninth node and a second end operatively coupled to the tenth node a first buffer having an input operatively coupled to the ninth node and an output operatively coupled to the first node; and a second buffer having an input operatively coupled to the tenth node and an output operatively coupled to the fifth node.

10. The apparatus of claim 9, wherein the amplifier circuit comprises a current-feedback operational amplifier.

* * * * *